United States Patent
Saraf et al.

(10) Patent No.: US 7,749,561 B2
(45) Date of Patent: Jul. 6, 2010

(54) FABRICATION OF ULTRA LONG NECKLACE OF NANOPARTICLES

(75) Inventors: Ravi F. Saraf, Lincoln, NE (US); Sanjun Niu, Mundelein, IL (US); Vikas Berry, Manhattan, KS (US); Vivek Maheshwari, Lincoln, NE (US)

(73) Assignee: Nutech Ventures, Lincoln, NE (US)

( * ) Notice: Subject to any disclaimer, the term of this patent is extended or adjusted under 35 U.S.C. 154(b) by 949 days.

(21) Appl. No.: 11/491,840

(22) Filed: Jul. 24, 2006

(65) Prior Publication Data

US 2010/0120236 A1 May 13, 2010

Related U.S. Application Data

(60) Provisional application No. 60/701,598, filed on Jul. 22, 2005.

(51) Int. Cl.
*B05D 1/18* (2006.01)
*B05D 1/12* (2006.01)

(52) U.S. Cl. .................. 427/180; 427/430.1; 427/443.2; 427/202

(58) Field of Classification Search ............... 427/430.1, 427/443.2, 402, 331, 180, 202
See application file for complete search history.

(56) References Cited

OTHER PUBLICATIONS

Dai et al. A "Nanonecklace" Synthesized from Monofunctionalized Gold Nanoparticles. J. Am. Chem. Soc. 2005, 127, 8008-8009.*
Middleton, A.A. & Wintergreen, N.S., Collective Transport in Arrays of Small Metallic Dots, Physical Review Letters 71, 3198-3201 (1993).
Berry, V., Rangaswamy, S., & Snaraf, R.F., Highly Selective, Electrically Conductive Monolayer of Nanoparticles on Live Bacteria, Nano Letters 4, 939-942 (2004).
Sato, T., Ahmed, H., Brown, D. & Johnson, B.F.G., Single Electron Transistor Using a Molecularly Linked Gold Colloidal Particle Chain, Journal of Applied Physics 82, 696-701 (1997).
Imamura, H., Coulomb Staircase in STM Current Through Granular Films, Physical Review B 61, 46-49 (2000).

* cited by examiner

*Primary Examiner*—David Turocy
(74) *Attorney, Agent, or Firm*—Fish & Richardson P.C.

(57) ABSTRACT

The present invention provides a single-electron device composed of a necklace of about 5000 nanoparticles. The linear necklace is self-assembled by interfacial phenomena along a triple-phase line of fiber, a substrate and electrolyte containing nanoparticles. A variety of combinations of nanoparticles, such as Au and CdS nanoparticles, may be used to form a necklace. The I-V measurements on the system show both coulomb blockade and staircase, with high currents and high threshold voltage of 1-3 V. The present invention also provides methods for constructing such a device.

13 Claims, 10 Drawing Sheets

FABRICATION OF ULTRA LONG NECKLACE OF NANOPARTICLES

CROSS-REFERENCE TO RELATED APPLICATIONS

This application claims the benefit of U.S. Provisional Application Ser. No. 60/701,598, filed Jul. 22, 2005 and entitled "Fabrication of Ultra Long Necklace of Nanoparticles and Application Thereof," which is hereby incorporated herein by reference. This application is related to patent application entitled "Highly Resolved, Low Noise, Room-Temperature Coulomb Staircase and Blockade up to 2.2V in Isolated 50 Micron Long One Dimensional Necklace of 10 NM Au Particles" filed on Jun. 29, 2006.

STATEMENT REGARDING FEDERALLY SPONSORED RESEARCH OR DEVELOPMENT

None.

BACKGROUND OF THE INVENTION

As electronics technology shrinks, the performance of devices based on conventional semiconductors will become more challenging due to fundamental physical limits and more complex and expensive lithography processes. For example, statistical fluctuation in dopant concentration will add significant variability in the threshold voltage (i.e., gate voltage for drain current switched on) among devices on the chip as the channel width shrinks well beyond 100 nm; higher electric fields due to smaller distances can lead to avalanche (breakdown) of electrons causing progressive damage to the device; and the concomitant shrinkage of characteristics features (i.e., gate oxide and depletion layer thickness) could lead to current leakage due to quantum mechanical electron tunneling effect. Devices based on alternative physical phenomena to attain electronic switching without dopant and low (preferably single) electron transport are of great interest. It has been long known over two decades that nanoscale metal island isolated by dielectric barrier is an attractive solution to fabricate switching device for logic and memory where the charge transport is regulated at single-electron level. The single-electron tunneling (SET) junction occurs due to low capacitance of the island to store charge causing a Coulomb blockade against the next electron insertion into the nanoscale island. The result is a highly non-linear current (I)-voltage (V) characteristics where the current abruptly increases over a threshold bias, $V_{CB}$ that overcomes the required Coulomb blockade energy. However, the blockade energy, $U=0.5$ $EV_{CB}$ (approximately 1 meV for 100 nm island) is very low requiring operation below 10K to avoid thermal fluctuations.

Recently, by replacing the lithographically patterned metal island with (usually Au) nanoparticle having diameter of approximately 3-10 nm, the threshold energy can be raised approximately 100 meV making it possible to obtain Coulomb blockade at room temperature. SET devices operating at room and low temperatures, such as transistors and negative-differential-resistance using single nanoparticle have been demonstrated. However, for a viable single-electron digital device the charging energy must be approximately 100 kT to avoid thermally induced random tunneling. Thus, for a practical SET device operating at room temperature, $V_{CB}$ must be approximately 2.5V, a 25-fold increase from currently achieved nanoparticle based devices. Extending the above idea to particles <1 nm, $V_{CB}$>5 V has been demonstrated in one recent study. However, for d<1 nm, the blockade characteristics are significantly smeared due to high sensitivity to size variations (approximately $d^3$) caused by energy quantization effects; the operating currents drop by $10^3$ fold in <1 pA as particle size decreases from about 1.8 nm to 0.7 nm, and charge fluctuations lead to significant drift in the I-V characteristic features over time. Based on theoretical calculations, a one dimensional necklace of larger nanoparticles could be an ideal structure to achieve higher switching voltages, with higher currents.

Electronic devices at nanoscale dimensions have the potential of achieving high performance with significantly lower power consumption compared to current devices. To reach this goal, existing studies on individual nanodevices must be translated from the isolated device-level to the circuit-level. Creating a circuit-level nanodevice system by simply scaling the silicon-based complementary metal oxide semiconductor (CMOS) devices to the nanoscale level is not possible due to entropy-driven fluctuations in the concentration of the dopant, which increases variability in device characteristics. Thus, dopant-free devices are of great interest. Logic circuits of nanodevices using one-dimensional nanostructures such as carbon nanotubes and doped semiconducting nanowires have been demonstrated. Although nanotubes do not require dopant, they are not very pure chemically—a batch of synthesized nanotubes is mixture of conducting, semiconducting and insulating tubes that are not possible to separate at the present time. Furthermore, the determination of their electrical properties is only obtained once the device is fabricated. Nanowires, on the other hand, have to be doped to build device.

BRIEF SUMMARY OF THE INVENTION

The present invention provides an ultra long nanoparticle necklace and methods for constructing ultra long nanoparticle necklaces. The present invention provides a highly resolved, low noise, room temperature Coulomb-staircase and blockade and methods for constructing a Coulomb-staircase and blockade in accordance with the present invention. The present invention may utilize a substrate with at least one pair of electrodes. Fibers, such as polystyrene fibers, may be spun out of a solution on the substrate such that a fiber extends across the pair of electrodes. The substrate and fibers may then be immersed in a solution containing suspended nanoparticles of a first type that adhere to the fibers, thereby forming a one dimensional necklace of nanoparticles between the electrodes. The substrate may thereafter be immersed in a solution containing suspended nanoparticles of a second type that adhere to the nanoparticles of the second type.

DETAILED DESCRIPTION OF THE INVENTION

The present invention provides a general approach to achieve a large enhancement in $V_{CB}$ by self-assembling a near perfect one-dimensional (1-D) "necklace of nanoparticles." An exemplary embodiment described herein uses approximately 5000 Au particles of diameter of approximately 10 nm. In this exemplary embodiment, sites in the necklace are isolated "islands" with SET characteristics that lead to an extremely high, robust and reproducible $V_{CB}$ of about 2.2 V. The self-assembly is a simple process where the nanoparticles agglomerate at an edge of a polymer fiber to produce a 1-D percolating channel. A simple model based on a composite structure of "ohmic channels" and single nanoparticle "islands" explains the large $V_{CB}$ behavior. For longer deposition time, there is an annealing effect such that the currents jump by approximately 5-fold and a sharp Coulomb staircase behavior is observed. The charging energy is same as the pure blockade behavior corresponding to $V_{CB}$ of approximately 2.2V and the nanoparticle (island) resistance is consistent with reported single-nanoparticle SET devices operating at room temperature.

Figure 1:
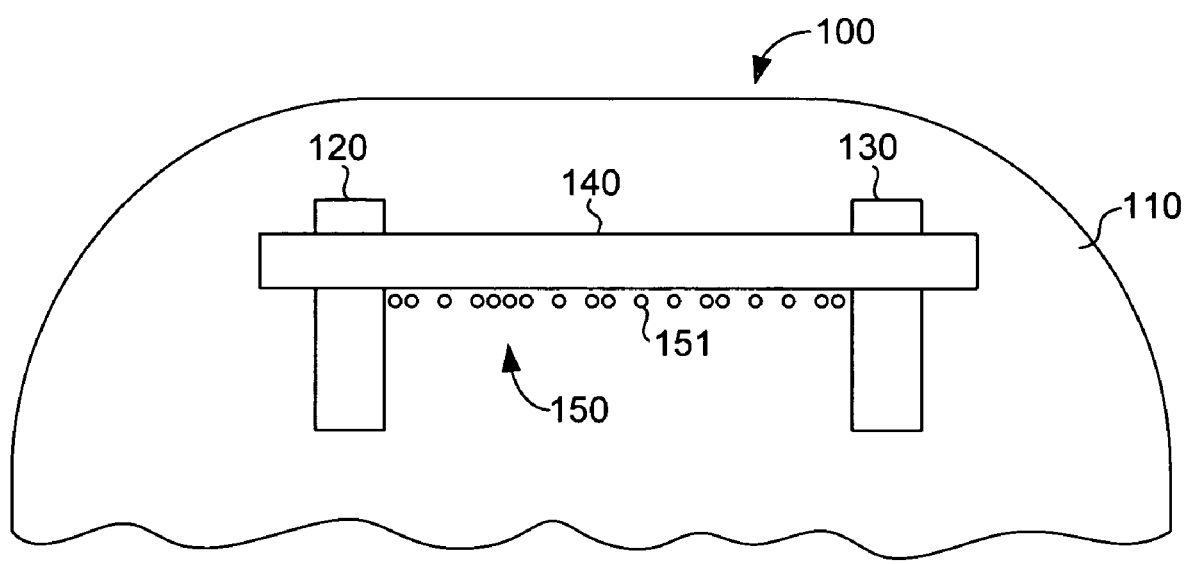
FIG. 1 illustrates a nanoparticle necklace in accordance with the present invention schematically.

FIG. 1 illustrates an example of a nanoparticle necklace 100 in accordance with the present invention. FIG. 1 is not to scale. A substrate 110 may be comprised of a layer of $SiO_7$ over a Si wafer. A pair of electrodes 120, 130 may comprise a set of 1 mm wide Au electrodes spaced at 50 µm apart on substrate 110, although other types and sizes of electrodes may be used. Fiber 140 may comprise a polystyrene fiber extending across the pair of electrodes 120, 130, although other types of fibers may be used. A plurality 150 of nanoparticles, such as nanoparticle 151, are adhered to fiber 140 between first electrode 120 and second electrode 130. While plurality 150 of nanoparticles may be selected to possess any type of electrical and/or chemical properties desired, in the exemplary embodiment nanoparticles of Au having a diameter of approximately 10 nm are used.

Figure 2:
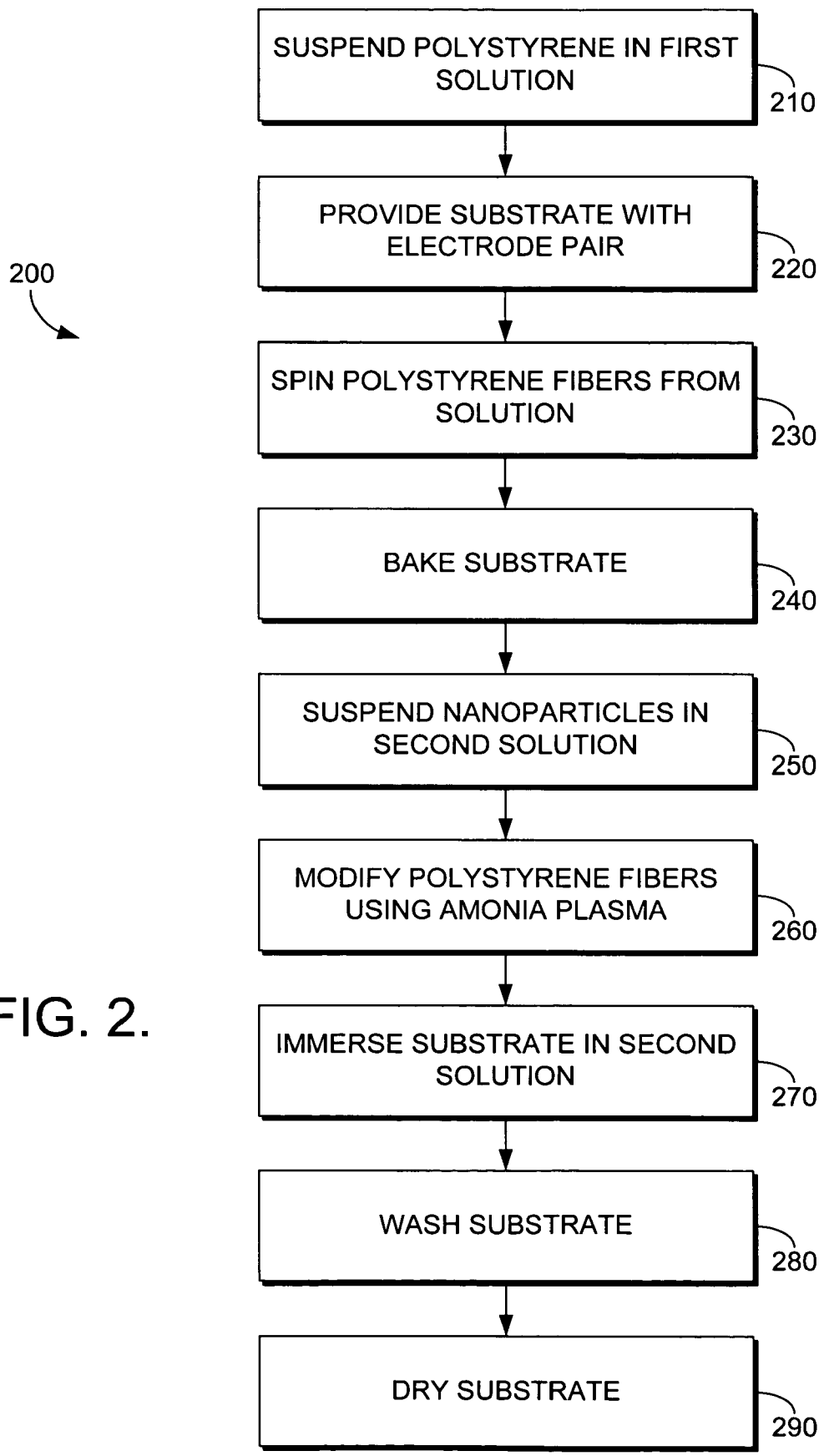
FIG. 2 illustrates a method for constructing a nanoparticle necklace in accordance with the present invention.

FIG. 2 illustrates a method 200 for fabricating a necklace of nanoparticles in accordance with the present invention. In step 210 fiber material, such as polystyrene, may be suspended in a first solution. In step 220 a substrate, such as described above with regard to FIG. 1, having an electrode pair may be provided. In step 230 the fibers may be spun from the solution. For example, polystyrene fibers may be spun on a substrate using spindle rotating at approximately 5000 rpm from an approximately 15% solution in toluene. The diameter of the fibers may be approximately 600 nm. The fibers may cross a set of 1 mm wide Au electrodes spaced at 50 µm on the substrate. The substrate and fibers may be subsequently baked in vacuum of approximately 1 mtorr at approximately 120° C. for about 20 minutes to flatten the fibers at the fiber/substrate interface. In step 250 nanoparticles may be suspended in a second solution. The suspended nanoparticles may be negatively charged 10 nm Au particles. The second solution in which the nanoparticles are suspended may be an aqueous solution at pH of approximately 4. In step 260 the polystyrene fiber surface may be modified with an amine group by exposure to ammonia plasma for approximately 20 seconds. After step 260 method may immediately proceed to step 270, in which the substrate and fibers may be immersed in the second solution containing suspended nanoparticles. The immersion of step 270 may last for approximately 8 hours. In step 280 the substrate and structures on the substrate may be washed thoroughly with water. In step 290 the substrate and structures on the substrate may be air-dried. One skilled in the art will appreciate that the temperatures, pressures, pHs, time periods, solution types, and material types described above are approximate only, and may be varied without departing from the scope of the present invention.

Figure 3:
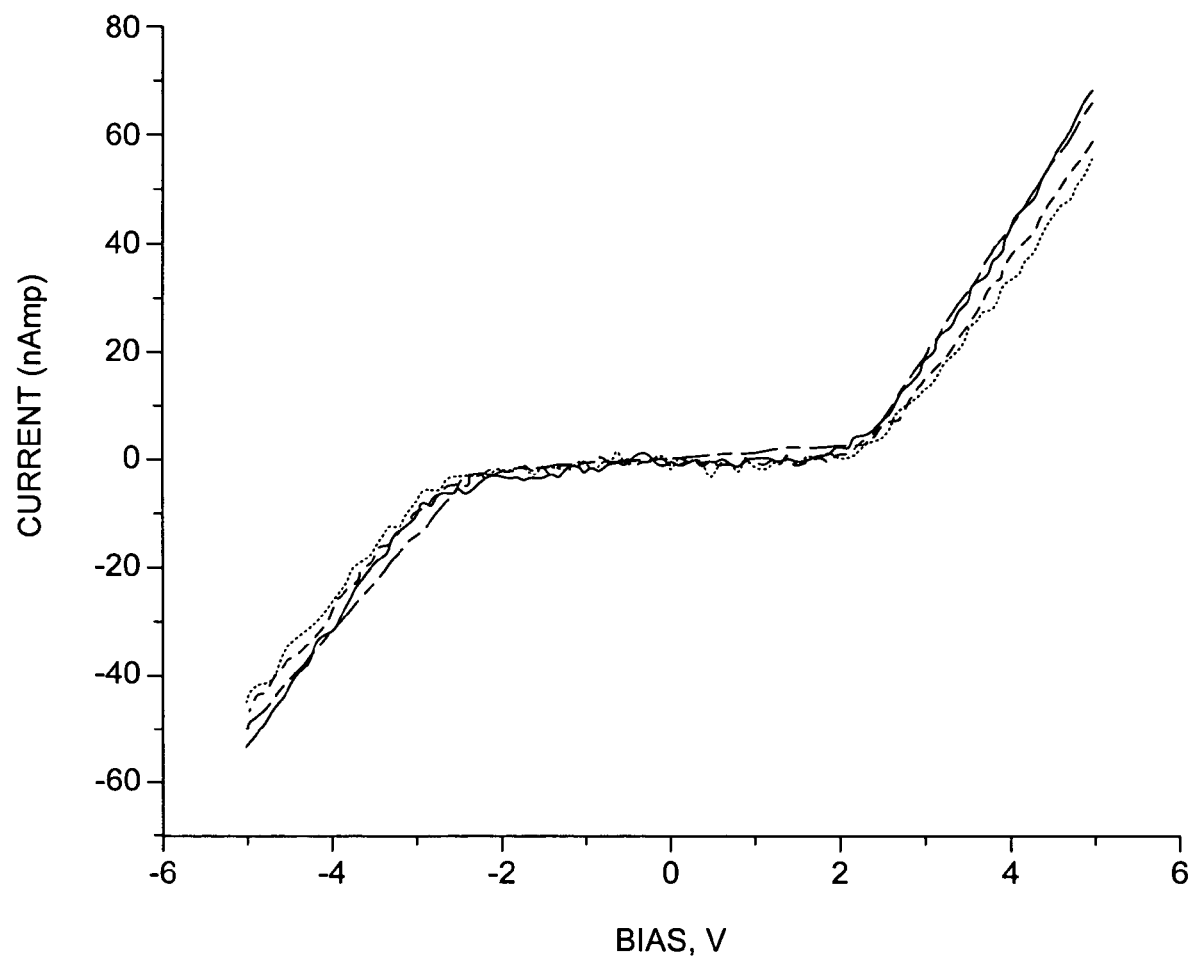
FIG. 3 illustrates the electrical properties of a nanoparticle necklace in accordance with the present invention.

FIG. 3 illustrates the electrical properties of a nanoparticle necklace in accordance with the present invention. Typical characteristics of a nanoparticle necklace in accordance with the present invention include: (i) a highly well defined $V_{CB}$ at about 2.2 V; (ii) the I-V is robust over several I-V cycles spanning multiple days; (iii) virtually no hysteresis is observed; (iv) the behavior after the threshold voltage is linear, indicating transport in a 1-D necklace; (v) most significant are the switching characteristics: over an excursion of 1.7 to 2.7 V the current changes by 6.5 fold (from 2 V to 6 V it changes 31 fold, from 1 to 2V the increase is 2 fold, while from 2 to 3 V, the increase is 9 fold); and (vi) the operating current is high, in $10^1$ nA range.

The capacitance of a nanoparticle of diameter d, surrounded by organic tunneling barrier of dielectric constant, $\in$, is $c_{np}=2\pi\in\in_0 d$, where $\in_0$ is the permittivity in vacuum. Therefore, for a single nanoparticle device of d=10 nm, the energy to charge the particle with a second electron is, $U=e2/(2 \in\in_0 d)$ 0.065 eV corresponding to about 3 kT at room temperature. Thus, the passage of electron above a threshold bias of $V_{CB}$ of about 0.065 V will not be blocked by Coulomb repulsion. The 50 fold increase in the $V_{CB}$ compared to single 10 nm particle measurements is explained as follows.

Referring again to FIG. 1, the nanoparticle necklace may be thought of as being composed of "clusters" with identical single nanoparticle "islands" marked. The "clusters" are closely packed nanoparticles, perhaps aided by some adjacent rows of nanoparticles, where the tunneling resistance is low resulting in a close to Ohmic behavior similar to high density monolayer of nanoparticles. The islands are a single nanoparticle spaced by a larger gap leading to SET characteristics. For bias below $V_{CB}$, the necklace can be assumed to be a pure capacitor with a capacitance, $c_t=c_{np}/n$, where n is the number of islands, and $c_{np}$ is the individual capacitance of the nanoparticle residing in the island. At $V_{CB}$ corresponding to charging each of the islands with a single electron charge, e, is given by $n^2 e/c_{np}$ or $n^2 e/c_{np}$. Thus, the $V_{CB}$ corresponding to single nanoparticle is amplified by $n^2$ in the 1-D necklace. For bias above $V_{CB}$, the current rises linearly following Ohms law with an effective resistance of $R_t=n(R_{np}+R_c)$, where $R_c$ and $R_{np}$ are cluster and the nanoparticle island resistances, respectively. At a total bias, V, between the electrodes leading to current I, the resistive drop across the island nanoparticle, $R_{np}$ is given by, $f(V-V_{CB})/n=IR_{np}$, where $f=R_{np}/(R_{np}+R_c)$. Thus the I-V characteristics for $V>V_{CB}$ becomes, $V=V_{CB}+IR_t$ which is consistent with observations in FIG. 3. This equation is similar to $I \alpha [V/V_{CB}-1]f$, where $f=1$ for 1-D arrays. Assuming, an $\in\sim 3$ (reasonable for organic surrounding), $c_{np}\sim 2.5\times 10^{-18}$ F. For a measured $V_{CB}$ of 2.2V, the number of SET islands $n=(c_{np}V_{CB}/e)^{0.5}$ are about 6. Within 10%, it is reasonable to neglect $R_c$ relative to $R_{np}$, i.e., f approximately 1. Based on the measured $R_t$ of approximately 42.2 MΩ, the estimated value of SET resistance, $R_{np}\approx R_t/n\sim 7$ MΩ, which is reasonable compared to the reported values.

Figure 4:
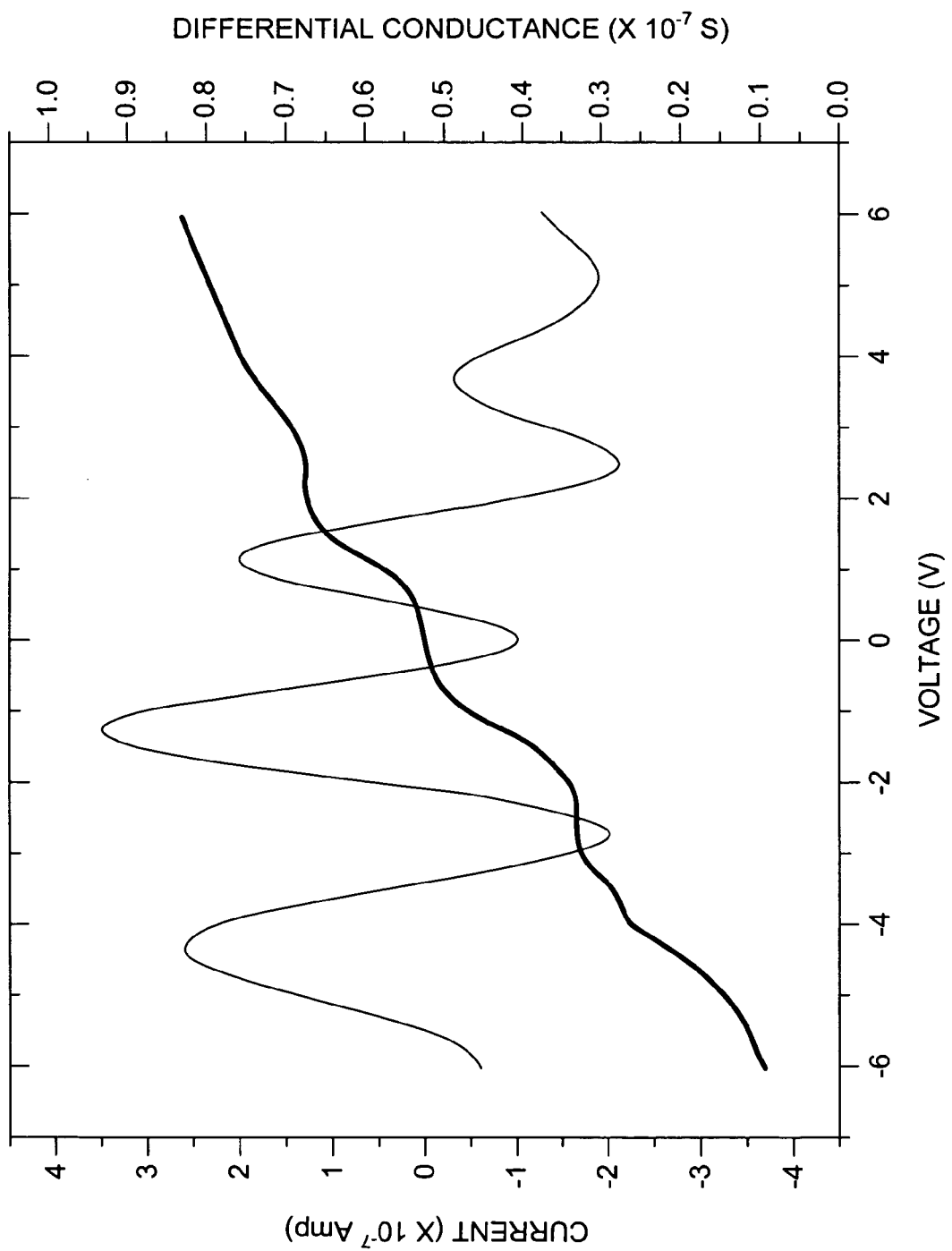
FIG. 4 further illustrates the electrical properties of a nanoparticle necklace in accordance with the present invention.

FIG. 4 shows an I-V of Au nanoparticle for 12 hour deposition exhibiting a Coulomb staircase effect. The periodic modulation of the differential conductance is about 2.2 V, indicating that the charging energy is identical to the Coulomb staircase, i.e., n~6. The I-V characteristics are similar to previously reported Coulomb staircases in single nanoparticle at room temperature, however the currents are 1 to 3 orders of magnitude larger and most importantly the switching voltage, $V_{CB}$ is increased form <0.1 V to 2.2V (i.e., charging energy is about 100 kT). Interestingly, contrary to theoretical models that predict the coulomb staircase cannot be obtained in isolated 1-D system due to significant smearing effects, a sharp staircase indicating high coherence in charge transport among the islands was observed.

The present invention further provides an approach to assemble a necklace of nanoparticles along an edge of a dielectric to fabricate a switching device that exhibits Coulomb staircase and blockade effects at room temperature. The switching voltage, $V_{CB}$~$n^2$ can be tailored by controlling the number of isolated islands in the necklace during the fabrication process. The following three features open the possibility of self assembling practical nanodevices based on coulomb blockade effect: (i) the I-V characteristics are robust (i.e., high reproducibility, large operating currents, and sharp blockade effect); (ii) $V_{CB}$ is close to about 100 kT at room temperature; and (iii) in principle the edge may be produced by patterning dielectric by lithographic techniques. With clever surface modification of edge and lithographic methods of patterning the edges, complex networks of nanoparticle necklaces could be fabricated to obtain robust digital devices operating at room temperature.

The present invention provides a method of making a necklace nanoparticles supported on an edge of a polymer fiber or a film. The necklace is a one-dimensional row of nanoparticles in contact with each other via a thin layer of organic substance, such as polymer and/or surfactant coating. The organic coating lets the electron "tunnel" through it but provides a small resistance. This tunneling barrier and small size of the nanoparticles makes the necklace a single-electron tunneling (SET) device. In other words, at low voltage across the necklace ends, the current is virtually zero because the electrons cannot pass through. As the voltage is above a threshold voltage, $V_T$ the current takes-off. This phenomenon of "coulomb blockade" is well known for over 4 decades, and can be used to build devices such as transistor, electronic switches.

The nanoparticle necklace in accordance with the present invention has imbedded SET devices, and the long chain nature provides the "circuitry" to connect to power and signal input/output interconnection terminals which may be electrodes. The necklace is a very versatile and general concept and may utilize more than one type of nanoparticles. Methods in accordance with the present invention may be used to build functional electronic switches and diodes. A necklace in accordance with the present invention can be shaped to any form required by the circuitization scheme just like copper lines on printed circuit boards.

A self-assembled nanoparticle necklace may be used as a basic electronic element in accordance with the present invention. Nanoparticle necklaces may comprise any number of types of nanoparticles. For exemplary purposes herein, nanoparticle necklaces having only a first type and a second type of nanoparticles are described, but further types of nanoparticles may be used. The types of nanoparticles used may be based upon their electrical properties (conducting, insulating, or semiconducting), although other properties such as size or chemistry may be considered. A polymer fiber maybe used as a scaffold to direct the assembly of a one-dimensional percolating structure for a nanoparticle necklace. The length and shape of the necklace may be determined by the polymer fiber.

Figure 5:
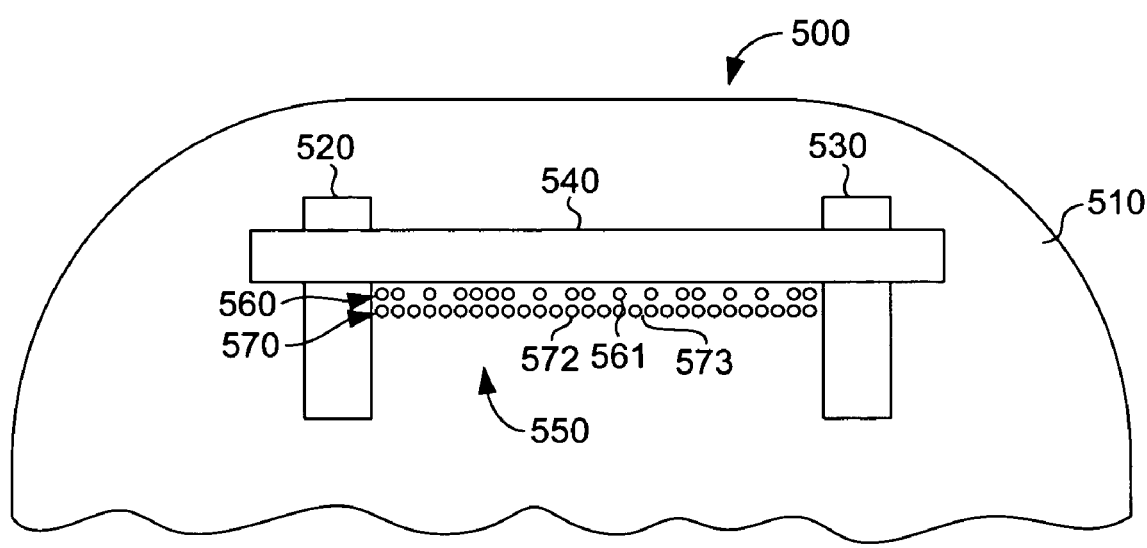
FIG. 5 illustrates a nanoparticle necklace having nanoparticles of a first type and a second type in accordance with the present invention.

Referring now to FIG. 5, a nanoparticle necklace 500 utilizing nanoparticles of a first type and nanoparticles of a second type is illustrated. FIG. 5 is not to scale. A substrate 510 maybe comprised of a layer of $SiO_2$ over a SI wafer. A pair of electrodes 520, 530 may comprise a set of one millimeter wide AU electrodes spaced at 50 micrometers apart on substrate 510, although other types and sizes of electrodes may be used. Fiber 540 may comprise a polystyrene fiber extending across the pair of electrodes 520, 530, although other types of fibers may be used. A plurality of nanoparticles of a first type 560, such as nanoparticles 561, adhere fiber 540 between first electrode 520 and second electrode 530. While plurality of nanoparticles of a first type 560 may be selected to possess any type of electrical and/or chemical properties desired, in the exemplary embodiment nanoparticles of Au having a diameter of approximately 10 nanometers are used. Although the Au particles as illustrated in FIG. 5 are deposited on the whole fiber, the high density deposition that electrically percolates is only at the edge. The inter-particle distance toward the center of the fiber is too high to form conducting channels. The fiber can be lifted off the surface by etching the $SiO_2$ in HF. A plurality of nanoparticles of a second type 570, such as nanoparticles 572, 573, are adhered to the nanoparticles of the first type 560. While the plurality of nanoparticles of a second type 570 may be selected to possess any type of electrical and/or chemical properties desired, in the exemplary embodiment semiconducting nanoparticles of CdS having a diameter of approximately three nanometers are used.

Figure 6:
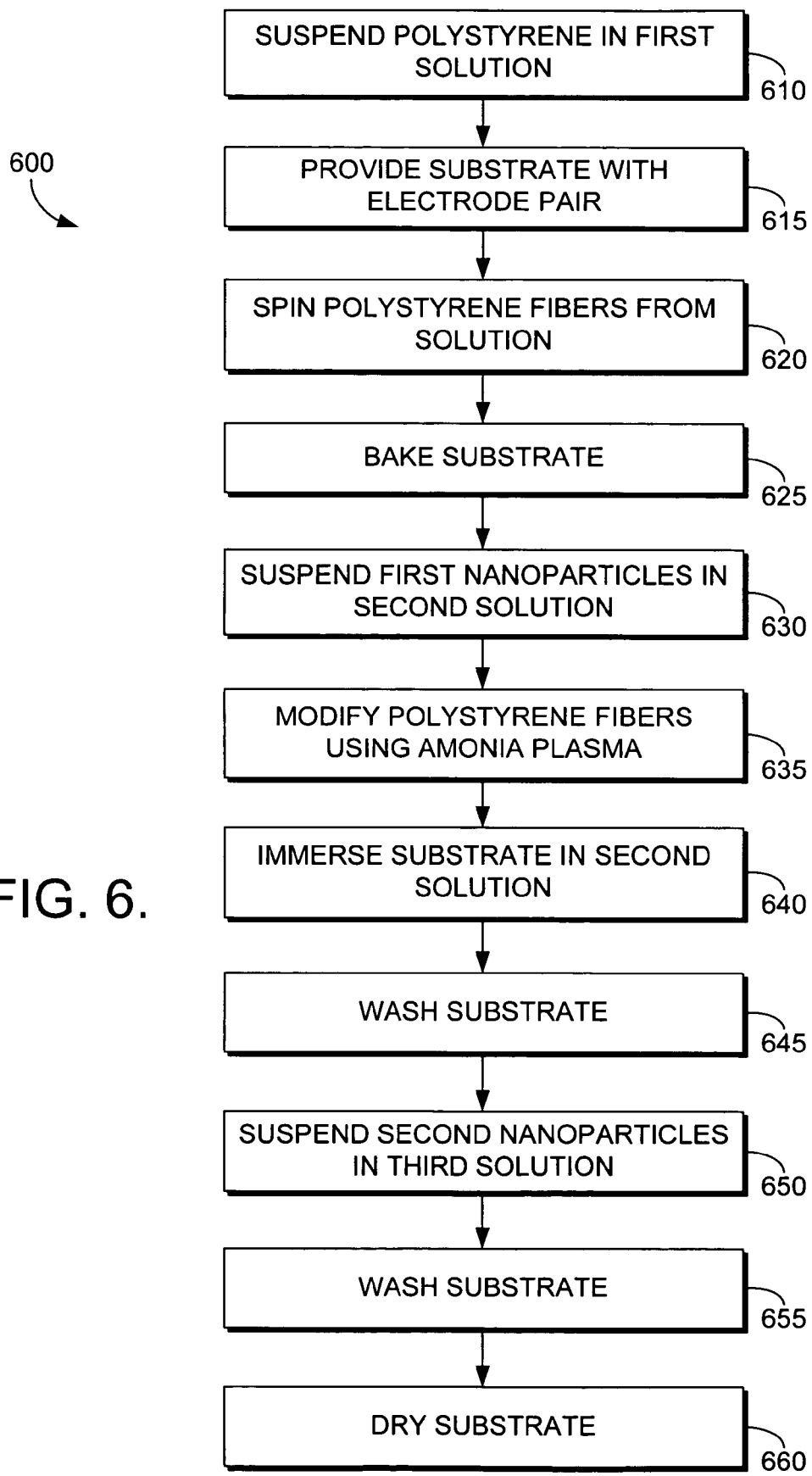
FIG. 6 illustrates a method for constructing a nanoparticle necklace having nanoparticles of a first type and a second type in accordance with the present invention.

FIG. 6 illustrates a method 600 for fabricating a necklace of nanoparticles in accordance with the present invention. In step 610 fiber material, such as polystyrene, may be suspended in a first solution. In step 615 a substrate, such as described above with regard to FIG. 5, having an electrode pair may be provided. In step 620 the fibers may be spun from the solution. For example, polystyrene fibers may be spun on a substrate using spindle rotating at approximately 5000 rpm from an approximately 15% solution in toluene. The diameter of the fibers may be approximately 600 nm. The fibers may cross a set of 1 mm wide Au electrodes spaced at 50 μm on the substrate. The substrate and fibers may be subsequently baked in vacuum of approximately 1 mtorr at approximately 120° C. for about 20 minutes to flatten the fibers at the fiber/substrate interface in step 625. In step 630 nanoparticles of a first type may be suspended in a second solution. The suspended nanoparticles of a first type may be negatively charged 10 nm Au particles. The second solution in which the nanoparticles are suspended may be an aqueous solution at pH of approximately 4. In step 635 the polystyrene fiber surface may be modified with an amine group by exposure to ammonia plasma for approximately 20 seconds. After step 635 method 600 may immediately proceed to step 640, in which the substrate and fibers may be immersed in the second solution containing suspended nanoparticles of a first type. The immersion of step 640 may last for approximately 8 hours. In step 645 the substrate and structures on the substrate may be washed thoroughly with water. In step 650 the substrate and structures on the substrate may be immersed in a solution containing nanoparticles of a second type. For example, the nanoparticles of a second type maybe positively charged 3 nm CdS particles. The substrate and structures on it may then be washed in step 655 and dried in step 660. One skilled in the art will appreciate that the temperatures, pressures, pHs, time periods, solution types, and material types described above are approximate only, and may be varied without departing from the scope of the present invention.

Figure 7:
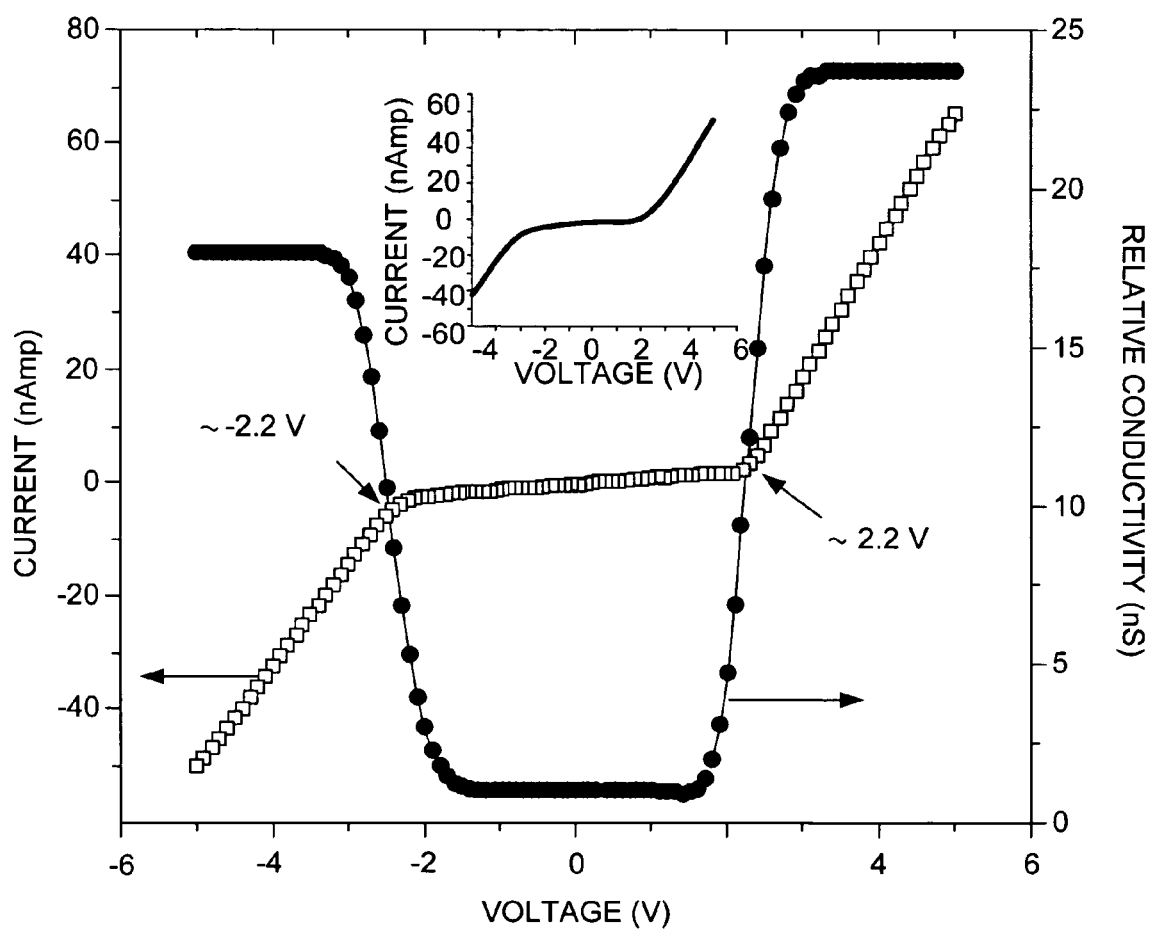
FIG. 7 illustrates the electrical properties of a nanoparticle necklace in accordance with the present invention.

FIG. 7 illustrates the electrical properties of a nanoparticle necklace in accordance with the present invention. All the currents measured are divided by two to represent the characteristics of a single necklace. FIG. 7 shows a typical I-V characteristic of 10 mm Au particles spanning over a 50 μm gap. The I-V characterization of the electrically percolating necklace of 5,000 particles was performed at a step size of 100 mV, and the instrument resolution for currents measurement was 1 pA. The measurements were performed in a vacuum ($10^{-5}$ torr) at room temperature.

The following points are salient characteristics of the device inferred from FIG. 7. First, there is a well-defined $V_{CB}$ is at ~2.2 V. Second, the I-V is robust over several I-V cycles spanning over a couple of days (see inset). Third, as shown in the inset, virtually no hysteresis was observed. Fourth, a linear behavior is observed beyond the threshold voltage, indicating transport in a one dimensional necklace. Fifth, over an excursion from 2V to 3V or 6V, the current change was 9-fold or 31-fold, respectively. Sixth, the operating current was high, in the STET nA range, compared to single-nanoparticle devices, with the STM tip interconnection indicating good contact resistance between the necklace and the Au electrode pads.

The 30-fold enhancement in $V_{O3}$ relative to a single 10 nm nanoparticle device can be explained by considering the necklace as a composite structure composed of percolating one dimensional clusters with isolated single-nanoparticle "islands". The clusters are closely packed nanoparticles, perhaps aided by some adjacent rows of nanoparticles, where the tunneling resistance was low, resulting in an Ohmic behavior at room temperature similar to a high density monolayer of nanoparticles. The isolated, single-nanoparticle islands were spaced by a larger gap, leading to SET characteristics. The capacitance of the nanoparticle island of diameter d, surrounded by an organic tunneling barrier of dielectric constant, $\in$, is $C_{np}=2\pi\in\in_0 d$, where $\in_\ddot{o}$ is the permittivity in the vacuum. Thus, for a single-nanoparticle device of d=10 nm, the energy to charge the particle with a second electron is $U=e^2/(2\pi\in\in_0 d)$ 0.065 eV, corresponding to ~3 kT at room temperature. Accordingly, the passage of an electron above a threshold bias of $V_{CB}$~0.065 V will not be blocked by coulomb repulsion. However, if the necklace has n islands, the charging energy is $U_T=e^2/c_t=n[e^2/c_{np}]$. Thus, $V_{CB}$ given by $e/c_t$ (or $n[e/c_{np}]$) is amplified by n times relative to single particle. From FIG. 7, for measured $V_{CB}$ of 2.2 V, n is approximately 36. For a bias above $V_{CB}$, the current rises linearly following Ohms law with an effective resistance of $R_t$=n $(R_{np}+R_c)$, where $R_c$ is a cluster and $R_{np}$ is the nanoparticle island resistances. At a total bias V between the electrodes leading to current I, the resistive drop across the island nanoparticle, $R_{np}$ is given by $f(V-V_{CB})/n=IR_{np}$, where $f=R_{np}/(R_{np}+R_c)$. Thus, the I-V characteristics for $V>V_{CB}$ become, $V=V_{CB}+IR_t$, which is consistent with observations in FIG. 7. The I-V characteristics are similar to I α $[V/V_{CB}-1]^f$, where $f=1$ implies 1D arrays. Assuming $\in$~3, which is reasonable for the organic surrounding, then $c_{np}$·2.5×$10^{-18}$ F. For a measured $V_{CB}$ of 2.2V, the number of SET islands n= $(c_{np}V_{CB}/e)^{0.5}$ is ~6. Within 10% error, it is reasonable to neglect $R_c$ relative to $R_{np}$, i.e., f~1. Based on the measured $R_t \approx R_t/n$~7 MΩ is reasonable compared to reported values.

Figure 8:
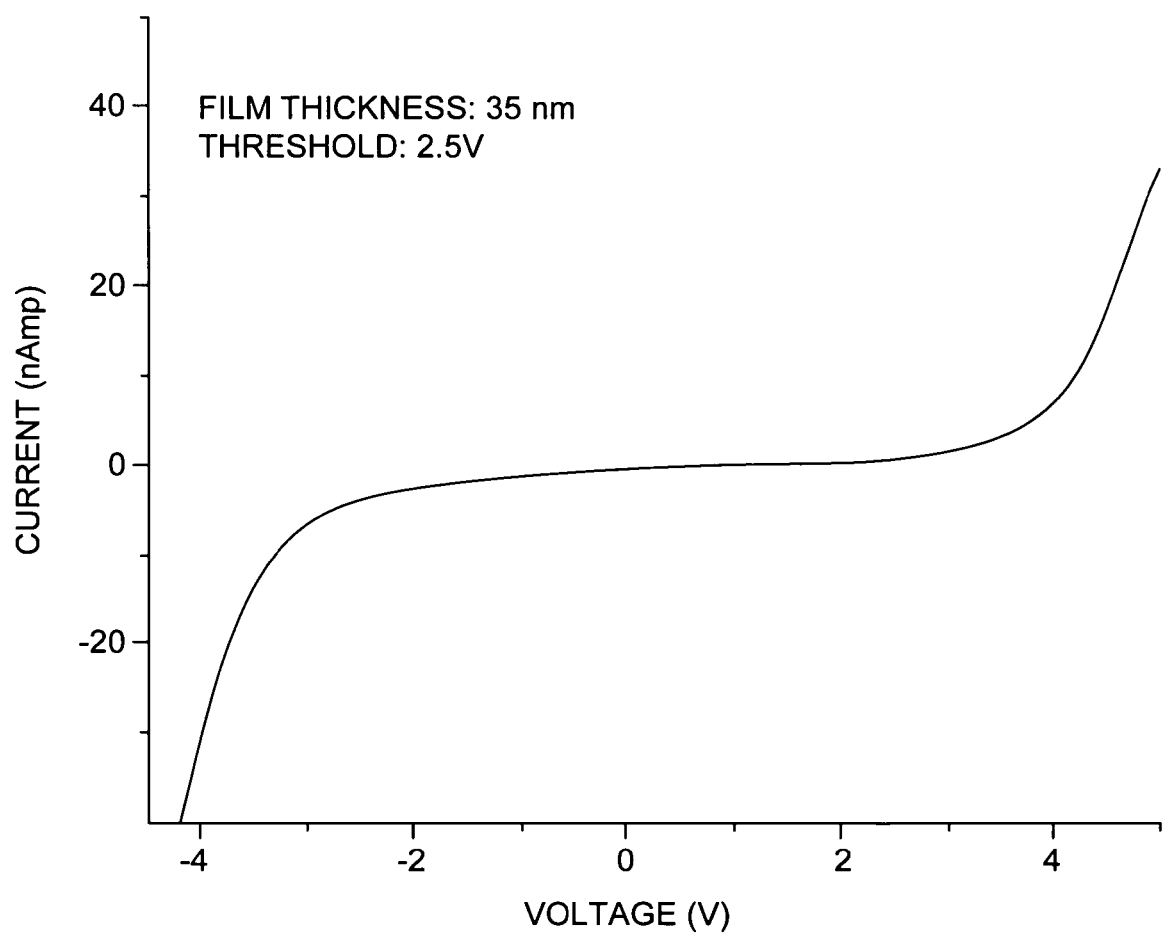
FIG. 8 further illustrates the electrical properties of a nanoparticle necklace in accordance with the present invention.

FIG. 8 illustrates the electrical behavior of a necklace of a 10 nm Au nanoparticle at the edge of an approximately 35 nm thick polymer film. The film was spin-coated on a Si wafer coated with a water soluble polymer and, then, floated on water. The floated film was placed on the substrate with Au electrodes using a standard method to fabricate a layer-by-layer, polymer-thin, film coating with nanometer-scale thickness. The subsequent process was similar to the fiber process. Similar to the fiber, the nanoparticle deposition on the fiber was sparse; however, a 1D necklace similar to the fiber was formed at the edge. The I-V behavior in FIG. 8 clearly shows similar coulomb blockade behavior indicating single-electron transport process.

Owing to the symmetry of the necklace, diode-like behavior would seem unlikely. However, it was discovered that by electrically annealing the necklace by applying bias on one electrode and leaving the other floating, it is possible to polarize the electrical conductivity in one direction. In the annealing process, one electrode was subjected to approximately 50 V with the other electrode left open. An Au/CdS nanoparticle necklace formed by step-wise co-deposition of the two particles followed by electric-annealing on one of the two electrodes would resemble necklace 500 illustrated in FIG. 5. The relative number fraction of CdS could be approximately 10%. Due to annealing, the Au/insulator/CdS/insulator/Au Schottky junctions would be asymmetric, leading to a diode-like I-V characteristic with no hysteresis. The resulting diode was highly reproducible and robust over 10 cycles showing no systematic hysteresis.

Figure 9:
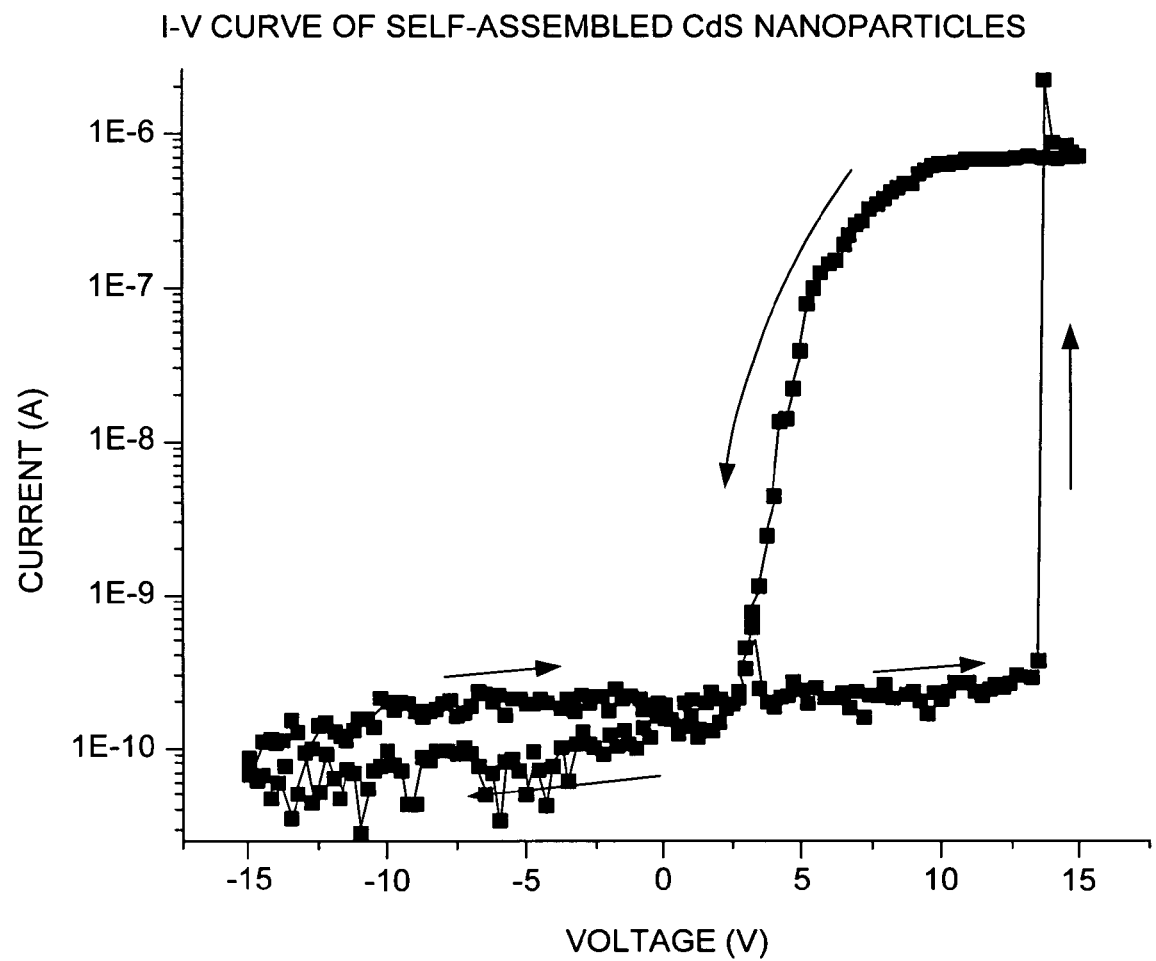
FIG. 9 further illustrates the electrical properties of a nanoparticle necklace in accordance with the present invention.

FIG. 9 illustrates the I-V characteristics of an Au (10 nm) and CdS (3 nm) necklace where the latter forms a "series" of Schottky devices along the necklace. The large switching current is observed only when the CdS is tethered with a highly ionic organic surfactant. Potentially the highly ionic surfactant stores charge, leading to blockade effect. In this molecular electronic device, organic molecule being the surfactant, robust switching with current ratio between the ON and OFF state of ~$10^4$ is obtained. Here, also, the necklace was electrically annealed in the forward direction. As can be seen, switching jump is robust. After 10V, the curve retraces well with no hysteresis.

Figure 10:
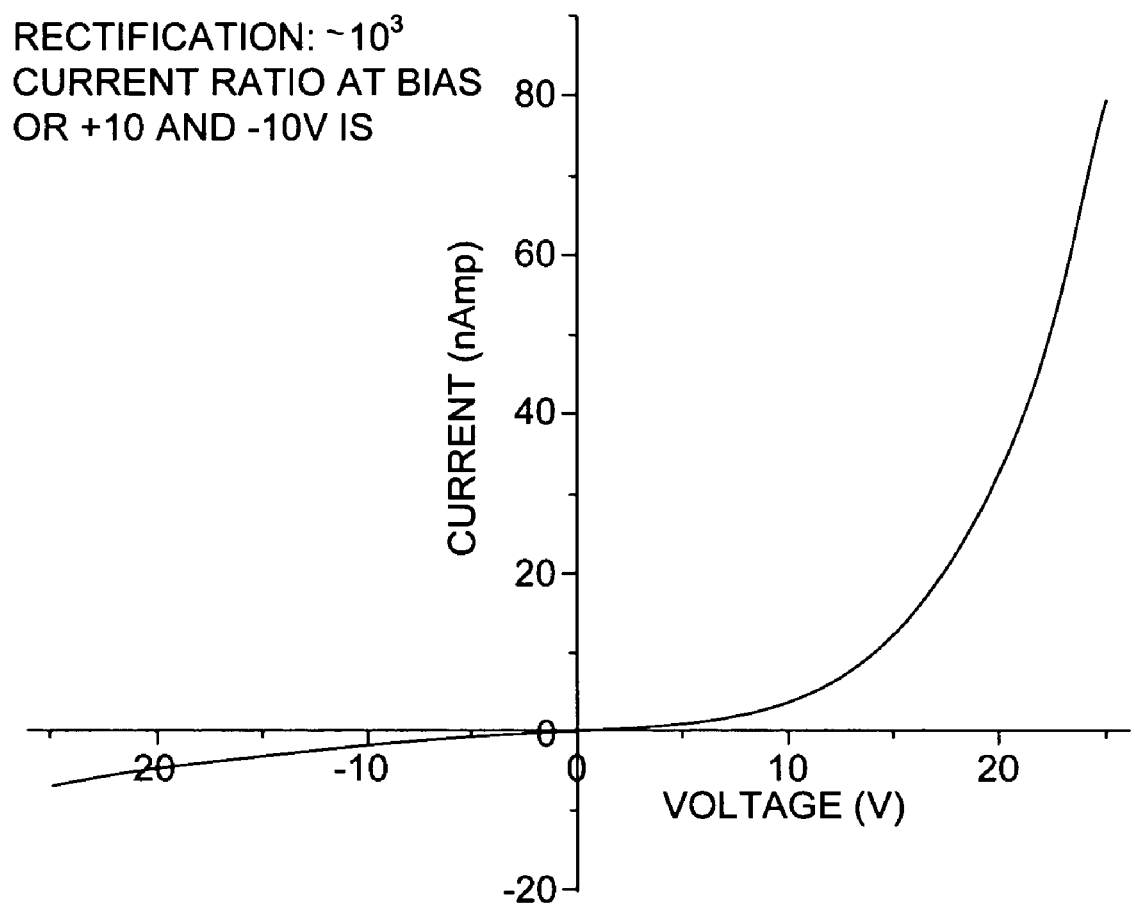
FIG. 10 further illustrates the electrical properties of a nanoparticle necklace in accordance with the present invention.

FIG. 10 illustrates the I-V characteristics of a Schottky necklace composed of Au and CdS nanoparticles spanning a 50 micrometer gap between electrodes. The ratio between current in forward bias (+10 V) and reverse bias (−10 V) is approximately $10^3$. The ratio increases to approximately $10^4$ for operation between +5 V and −5 V.

As the miniaturization continues from micron-scale to nanoscale devices, the nanoparticle necklace can be the next generation approach to make integrated circuit (IC) chip from nanodevices. Of course, a variety of types and sizes of nanoparticles beyond those described herein may be used for these purposes, and nanoparticles may be used alone or in combinations beyond those described herein. Likewise, methods of depositing nanoparticles may differ from those described herein, particularly with regard to the solutions and techniques used to deposit the nanoparticles.

What is claimed is:

1. A method for fabricating a necklace of nanoparticles, the method comprising:
    suspending fiber materials in a first solution;
    spinning the fibers from the solution on a substrate;
    suspending a first type of nanoparticles in a second solution;
    immersing the substrate and fibers in the second solution containing the suspended first type of nanoparticles, such that the suspended nanoparticles of the first type adhere to the fibers;
    suspending a second type of nanoparticle in a third solution; and immersing the substrate, fibers, and adhered nanoparticles of the first type in the third solution, such that the nanoparticles of the second type adhere to the nanoparticles of the first type.

2. The method for fabricating a necklace of nanoparticles of claim 1, further comprising:
baking the substrate and fibers after spinning the fibers from the solution on the substrate.

3. The method for fabricating a necklace of nanoparticles of claim 2, wherein:
the nanoparticles of a first type have an electrical charge; and
the nanoparticles of a second type have an electrical charge opposite the electrical charge of the nanoparticles of a first type.

4. The method for fabricating a necklace of nanoparticles of claim 1, further comprising:
washing the substrate after immersing the substrate in the second solution containing the suspended nanoparticles of a first type;
washing the substrate after immersing the substrate in the third solution containing the suspended nanoparticles of a second type; and
drying the substrate with the fibers, nanoparticles of a first type, and nanoparticles of a second type.

5. A method for fabricating a necklace of conducting nanoparticles and semiconducting nanoparticles on a substrate, the method comprising:
suspending fiber materials in first solution;
providing a substrate with a pair of electrodes;
spinning the fibers from the solution on the substrate such that a fiber crosses both of the pair of electrodes;
baking the substrate and fibers to flatten the fibers;
suspending conducting nanoparticles in a second solution;
immersing the substrate and fibers in the second solution containing the suspended conducting nanoparticles, such that the suspended conducting nanoparticles adhere to the fibers;
suspending semiconducting particle in a third solution;
immersing the substrate, fibers, and adhered conducting nanoparticles in the third solution, such that the suspended semiconducting nanoparticles adhere to the conducting nanoparticles;
washing the substrate, fibers, adhered conducting nanoparticles, and adhered semiconducting nanoparticles; and
drying the substrate, fibers, and nanoparticles.

6. The method for fabricating a necklace of conducting nanoparticles and semiconducting nanoparticles on a substrate of claim 5, wherein:
the fibers comprise polystyrene fibers.

7. The method for fabricating a necklace of conducting nanoparticles on a substrate of claim 6, further comprising:
modifying the surface of the polystyrene fibers by exposure to ammonia plasma prior to immersing the substrate and fibers in the second solution containing the suspended conducting nanoparticles.

8. The method for fabricating a necklace of conducting nanoparticles on a substrate of claim 7, wherein:
the conducting nanoparticles comprise negatively charged nanoparticles.

9. The method for fabricating a necklace of conducting nanoparticles on a substrate of claim 7, wherein:
the semiconducting nanoparticles comprise positively charged nanoparticles.

10. The method for fabricating a necklace of conducting nanoparticles on a substrate of claim 7, wherein:
the conducting nanoparticles comprise negatively charged Au nanoparticles; and
the semiconducting nanoparticles comprise CdS.

11. The method for fabricating a necklace of conducting nanoparticles on a substrate of claim 10, wherein:
the negatively charged Au nanoparticles have a diameter of approximately 10 nm, and the CdS nanoparticles have a diameter of approximately 3 nm.

12. The method for fabricating a necklace of conducting nanoparticles on a substrate of claim 11, wherein:
the pair of electrodes comprise Au electrodes spaced approximately 50 μm apart.

13. The method for fabricating a necklace of conducting nanoparticles on a substrate of claim 12, further comprising:
etching the substrate, fibers, adhered conducting nanoparticles, and adhered semiconducting nanoparticles in HF.

* * * * *

UNITED STATES PATENT AND TRADEMARK OFFICE
CERTIFICATE OF CORRECTION

| | | |
|---|---|---|
| PATENT NO. | : 7,749,561 B2 | Page 1 of 1 |
| APPLICATION NO. | : 11/491840 | |
| DATED | : July 6, 2010 | |
| INVENTOR(S) | : Ravi Saraf et al. | |

It is certified that error appears in the above-identified patent and that said Letters Patent is hereby corrected as shown below:

On page 1 after the title, please insert:

--STATEMENT AS TO FEDERALLY SPONSORED RESEARCH

This invention was made with government support under Grant No. CMS 0534812 awarded by the National Science Foundation. The government has certain rights in the invention.--

Signed and Sealed this

Seventeenth Day of August, 2010

David J. Kappos
*Director of the United States Patent and Trademark Office*